United States Patent
Chen

(10) Patent No.: US 7,385,820 B1
(45) Date of Patent: Jun. 10, 2008

(54) HEAT DISSIPATION MODULE

(75) Inventor: Yun-Sheng Chen, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/565,586

(22) Filed: Nov. 30, 2006

(51) Int. Cl.
*H05K 7/20* (2006.01)
*F28D 15/00* (2006.01)

(52) U.S. Cl. ............... 361/704; 361/700; 165/104.33; 165/185; 174/15.2; 174/16.3

(58) Field of Classification Search ........ 361/699–704, 361/709, 719; 165/80.4–80.5, 104.33, 185; 174/15.2, 16.3
See application file for complete search history.

(56) References Cited

U.S. PATENT DOCUMENTS

| | | | |
|---|---|---|---|
| 5,409,055 A * | 4/1995 | Tanaka et al. | 165/104.33 |
| 6,122,169 A * | 9/2000 | Liu et al. | 361/700 |
| 6,191,946 B1 * | 2/2001 | Yu et al. | 361/704 |
| 6,301,107 B1 * | 10/2001 | Lev et al. | 361/687 |
| 6,328,097 B1 * | 12/2001 | Bookhardt et al. | 165/104.33 |
| 6,351,382 B1 * | 2/2002 | Nakanishi et al. | 361/700 |
| 6,366,460 B1 * | 4/2002 | Stone et al. | 361/687 |
| 6,373,700 B1 * | 4/2002 | Wang | 361/698 |
| 6,504,720 B2 * | 1/2003 | Furuya | 361/699 |
| 6,771,497 B2 * | 8/2004 | Chen et al. | 361/687 |
| 6,859,368 B2 * | 2/2005 | Yang | 361/704 |
| 6,865,082 B2 * | 3/2005 | Huang et al. | 361/700 |
| 6,871,702 B2 * | 3/2005 | Horng et al. | 165/104.33 |
| 7,000,687 B2 | 2/2006 | Ying et al. | |
| 7,057,897 B2 * | 6/2006 | Leu | 361/704 |
| 7,274,572 B2 * | 9/2007 | Wang et al. | 361/719 |
| 2004/0188079 A1 * | 9/2004 | Chiou et al. | 165/185 |
| 2005/0006054 A1 | 1/2005 | Miyazaki et al. | |
| 2007/0121291 A1 * | 5/2007 | Wang et al. | 165/104.33 |
| 2007/0251675 A1 * | 11/2007 | Hwang et al. | 165/104.33 |

FOREIGN PATENT DOCUMENTS

KR 2005045093 A * 5/2005

* cited by examiner

*Primary Examiner*—Jayprakash N Gandhi
*Assistant Examiner*—Robert J Hoffberg
(74) *Attorney, Agent, or Firm*—Jeffrey T. Knapp

(57) ABSTRACT

A heat dissipation module for removing heat from a heat generating component, includes a block, a heat pipe and a fin unit. The block includes a first surface and a second surface. One end of the heat pipe is thermally attached to the fin unit, and the other end of the heat pipe is thermally attached to the first surface of the block. A groove is defined in the second surface of the block for fittingly receiving the heat generating component therein.

10 Claims, 5 Drawing Sheets

HEAT DISSIPATION MODULE

BACKGROUND OF THE INVENTION

1. Field of the Invention

The present invention generally relates to a heat dissipation module, and more particularly to a heat dissipation module for electronic elements.

2. Description of the Related Art

With the advance of large scale integrated circuit technology, and the widespread use of computers in all trades and occupations, in order to meet the required improvement in data processing load and request-response times, high speed processors have become faster and faster, which causes the processors to generate redundant heat. Redundant heat that is not quickly removed will have tremendous influence on the system security and performance.

To solve this problem of heat generated by the processor, a heat dissipation module is often mounted on the processor for dissipating heat. For enhancing the heat dissipation capability of the heat dissipation module, a thermal contact block is arranged for thermally contacting with the processor. The thermal contact block is made of a metal material with a high heat transfer coefficient such as copper.

Traditionally, the thermal contact block has a planar-shaped bottom surface for being thermally attached to a top surface of the processor. The contact surface area between the processor and the thermal contact block depends on the area of the top surface of the processor. Because of the miniaturization of the processor, the contact surface area between the processor and the thermal contact block is limited, affecting the heat transfer rate from the processor to the thermal contact block, and accordingly decreasing the efficiency of the heat dissipation module.

Therefore, it is desired to design a novel heat dissipation module to overcome the aforementioned problems and increase the heat dissipation efficiency thereof.

SUMMARY OF THE INVENTION

Accordingly, the present invention provides a heat dissipation module having a substantially larger contact surface area with a heat generating component which is cooled by the heat dissipation module.

The heat dissipation module for removing heat from the heat generating component comprises a thermal contact block, a heat pipe and a fin unit. The block comprises a first surface and a second surface. One end of the heat pipe is thermally attached to the fin unit, and the other end of the heat pipe is thermally attached to the first surface of the block. A groove is defined in the second surface of the block for fittingly receiving the heat generating component therein.

One advantage of the present invention is that a total contact surface area between the heat generating component and the block is dramatically increased due to the existence of the groove of the block. The heat generating component is fittingly received in the groove and brought into contact with the block three-dimensionally. Thus, the heat dissipation efficiency of the heat dissipation module can be greatly enhanced.

BRIEF DESCRIPTION OF THE DRAWINGS

The forgoing aspects will be better understood from the following detailed description of embodiment of the present invention with reference to the drawings, in which.

DETAILED DESCRIPTION OF THE INVENTION

Figure 1:
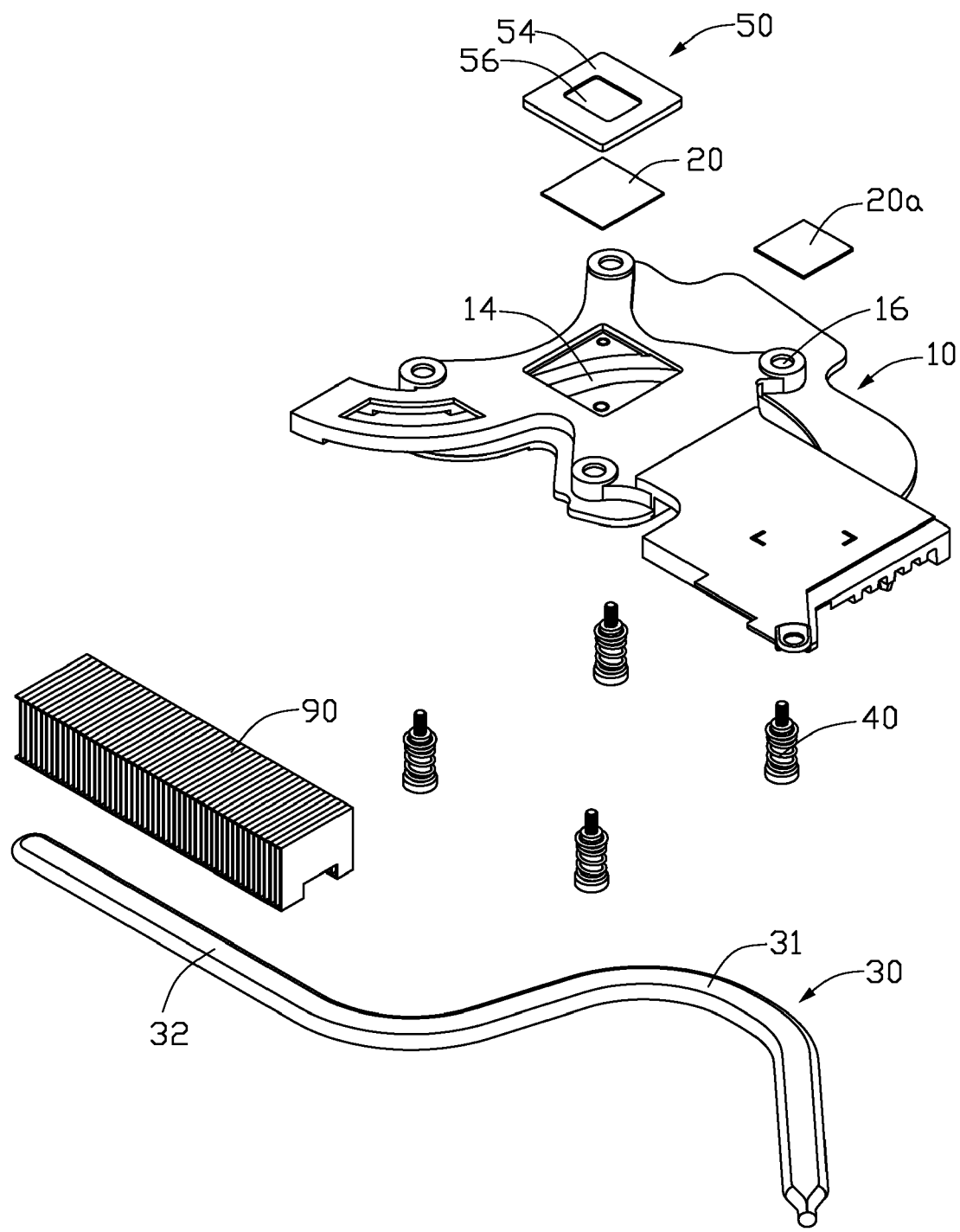
FIG. 1 is an isometric, exploded view of a heat dissipation module in accordance with a preferred embodiment of the present invention.
Figure 2:
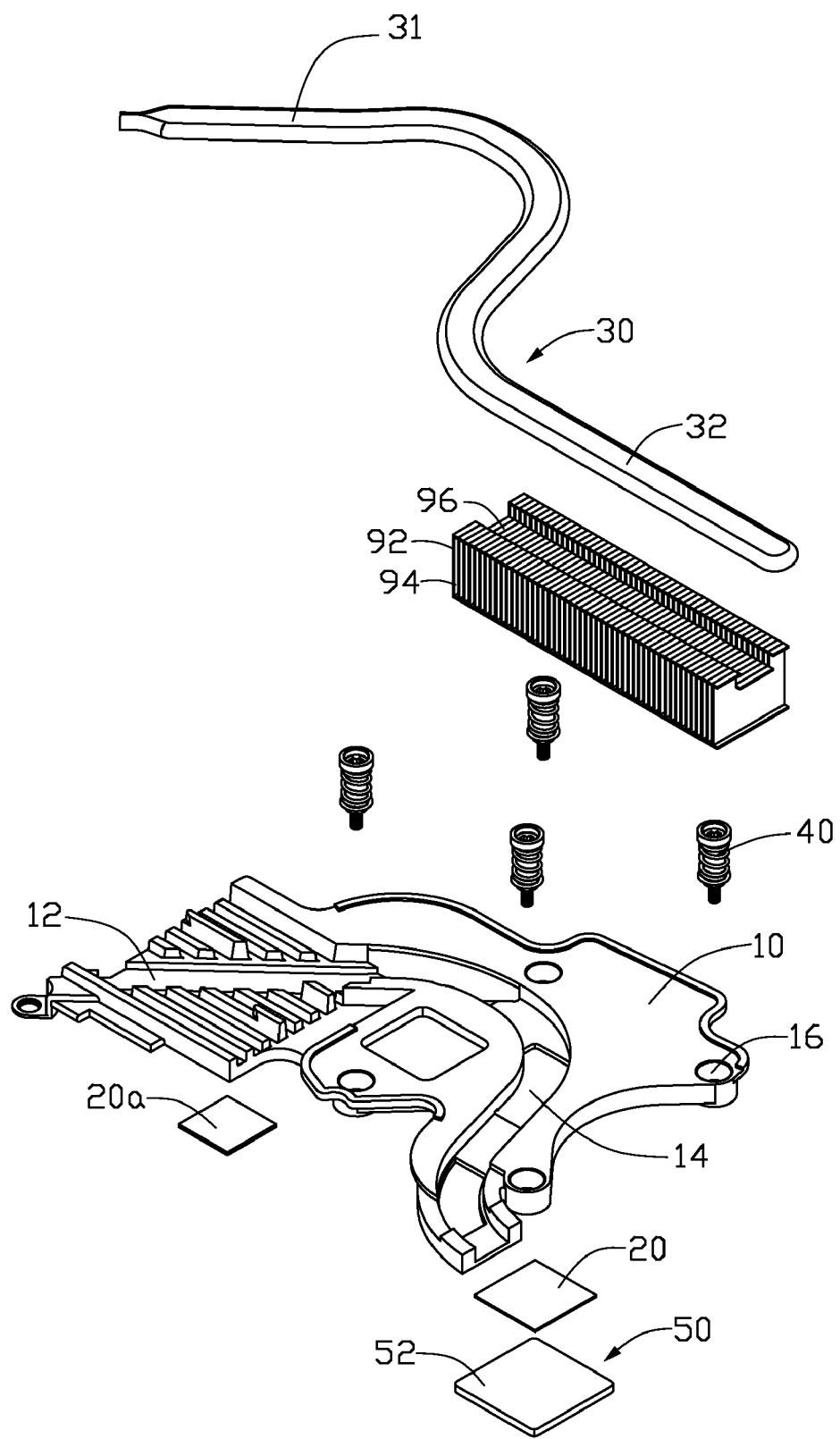
FIG. 2 is an isometric, exploded view of the heat dissipation module of FIG. 1, as viewed from another aspect.
Figure 3:
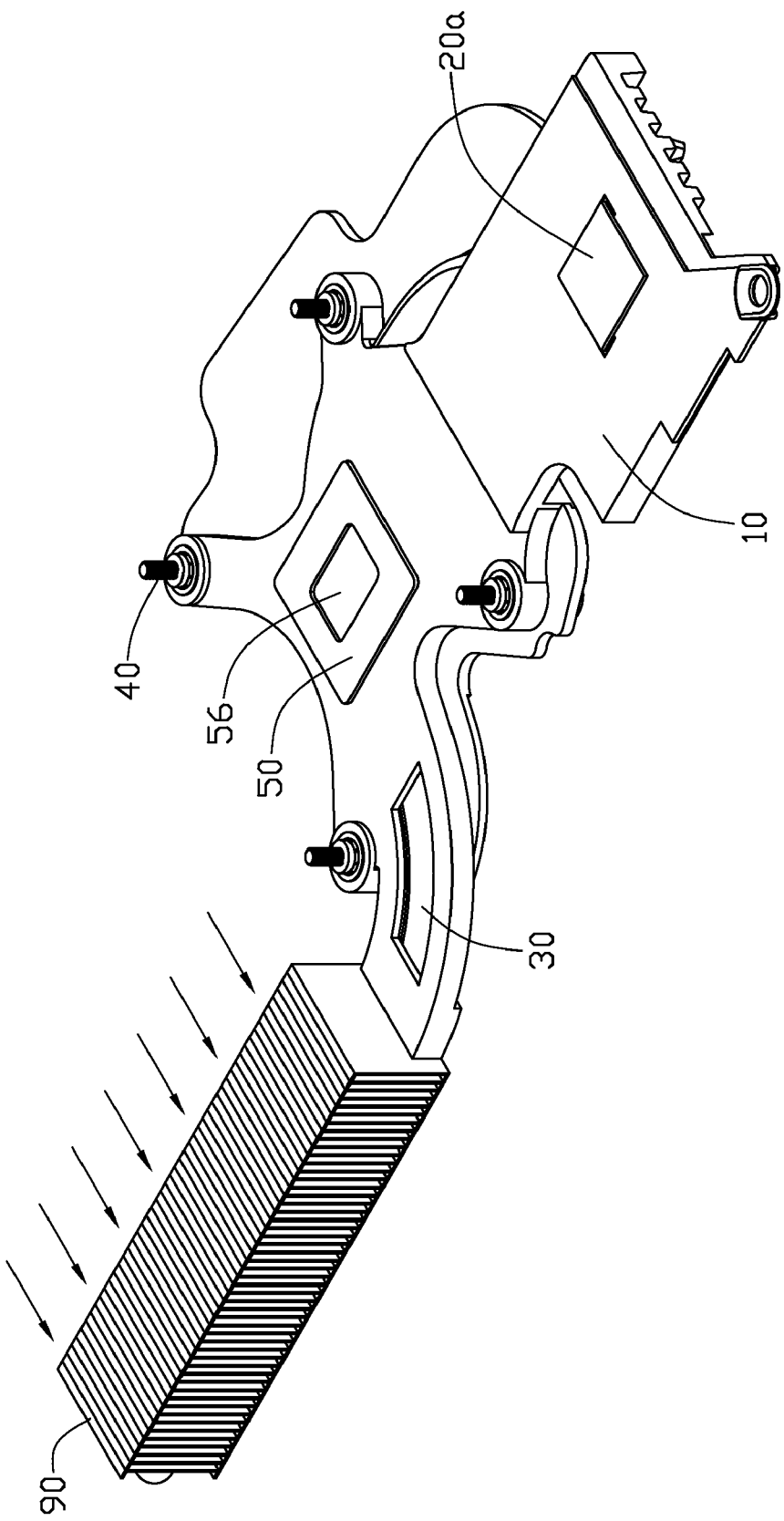
FIG. 3 is an assembled isometric view of the heat dissipation module in FIG. 1.

Referring to FIG. 1, FIG. 2 and FIG. 3, a heat dissipation module in accordance with a preferred embodiment of the present invention comprises a mounting seat 10, a heat pipe 30, a fin unit 90 and a thermal contact block 50.

A square-shaped receiving groove 14 is defined in a substantially central area of a top side of the mounting seat 10 for receiving the block 50 therein. A plurality of setting holes 16 are defined around the receiving groove 14 for allowing spring-loaded screws 40 to extend therethrough to secure the mounting seat 10 to a mainboard (not shown), such as a circuit board of a notebook computer. An arc-shaped groove 12 is defined in a bottom side of the mounting seat 10 for receiving the heat pipe 30 therein. The receiving groove 14 is connected to and communicates with the groove 12, in a manner such that the heat pipe 30 disposed in the groove 12 can be thermally connected to the block 50 disposed in the receiving groove 14.

The fin unit 90 comprises a plurality of fins 92. The fins 92 are spaced apart from each other by an essentially identical distance. A channel 94 is therefore formed between adjacent fins 92 for allowing a forced airflow (the direction of the airflow is shown by arrows in FIG. 3) to flow therethrough. A rectangular cutout 96 is defined in a bottom of each fin 92 so that these cutouts 96 cooperatively define an elongated U-shaped receiving space (not labeled). The heat pipe 30 comprises an evaporating portion 31 and a condensing portion 32 extending from the evaporating portion 31. The evaporating portion 31 is bent to have an arced shape corresponding to the shape of the arc-shaped groove 12 and disposed in the groove 12. The condensing portion 32 is disposed in the receiving space formed by the cutouts 96 of the fins 92 for thermally contacting the fin unit 90. The heat pipe 30 is partially flattened so as to increase its contact surface area with the fin unit 90 and the block 50.

Figure 4:
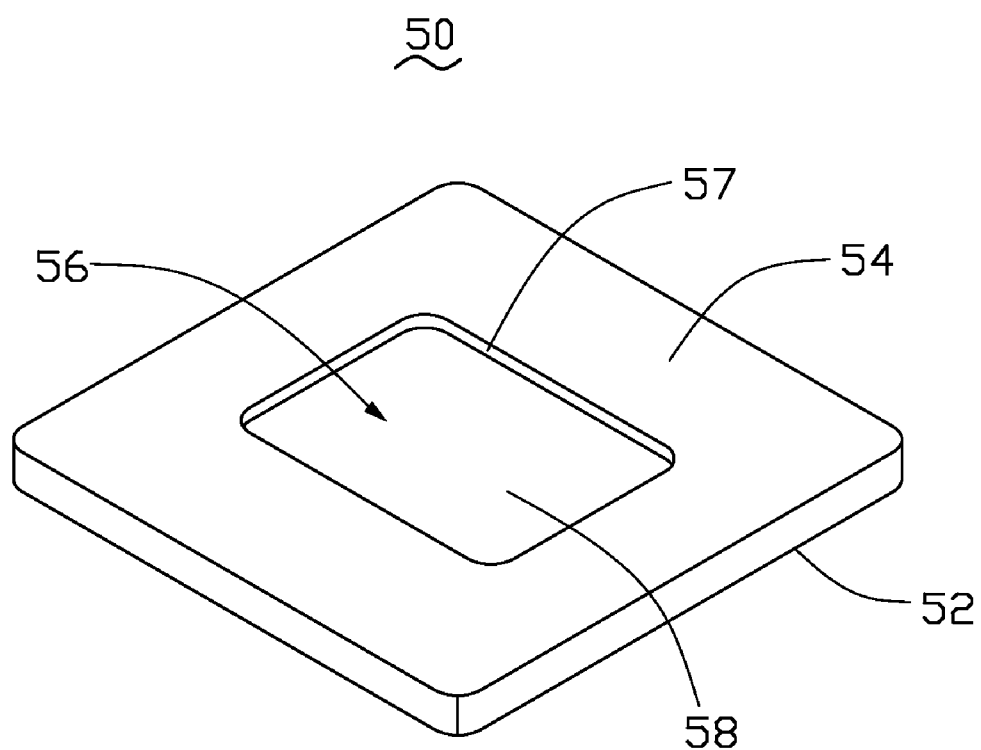
FIG. 4 is an isometric view of a thermal contact block of the heat dissipation module of FIG. 1.
Figure 5:
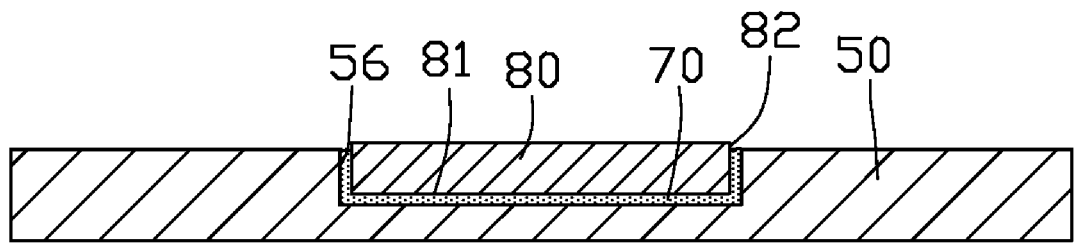
FIG. 5 is a cross-sectional view of the thermal contact block of FIG. 4, together with an electronic component attached thereto.

FIG. 4 is an isometric view of the block 50. The block 50 presents a square shape and is made of a metal material with a high heat transfer coefficient such as copper. The block 50 is disposed in the receiving groove 14 and comprises a bottom surface 52 and a top surface 54 opposite to the bottom surface 52. The bottom surface 52 of the block 50 is thermally attached to the heat pipe 30 and a thermal interface material 20 is commonly applied therebetween to reduce a heat resistance between the block 50 and the heat pipe 30. A groove 56 is defined in the top surface 54 of the block 50 for fittingly receiving a heat generating component 80 (FIG. 5), such as a CPU in a computer. The groove 56 in this embodiment is essentially rectangular-shaped and comprises four lateral sides 57 and a bottom 58. A chamfered corner (not labeled) is formed between adjacent lateral sides 57, and the lateral sides 57 are oriented perpendicular to the bottom 58. A substantially cubic space defined by the groove 56 is thus defined by the lateral sides 57 and the bottom 58. The heat generating component 80 includes a top surface 81 and a plurality of lateral sidewalls 82. The size of the bottom 58 and the height of each of the lateral sides 57 of the groove 56 depend on the size and height of the heat generating component 80 respectively. Thus the heat generating component 80 fits in the groove 56. In addition, a thermal interface material 70 may be placed between the heat generating component 80 and the lateral sides 57 and bottom 58 of groove 56 to reduce the heat resistance therebetween.

In assembly, the evaporating portion 31 of the heat pipe 30 is positioned in the arc-shaped groove 12 of the mounting seat 10, and the condensing portion 32 of the heat pipe 30 is received in the cutouts 96 and thus combined with the fin unit 92. The evaporating portion 31 of the heat pipe 30 is soldered to the mounting seat 10, while the condensing portion 32 of the heat pipe 30 is soldered to the fin unit 92. The block 50 is disposed in the receiving groove 14, and the heat generating component 80 is packaged in the groove 56 of the top surface 54 of the block 50. A part of the evaporating portion 31 of the heat pipe 30 located in the receiving groove 14 is thermally attached to the bottom surface 52 of the block 50 and the thermal interface material 20 is placed between the block 50 and the heat pipe 30 to reduce the heat resistance therebetween. Furthermore, a thermal interface material 20a is applied on the top surface of the mounting seat 10 at a position corresponding to a distal free end of the evaporating portion 31 of the heat pipe 30. Another heat generating component (not shown) such as a chipset of a graphics card, north bridge chipset or south bridge chipset, may advantageously be thermally attached to the thermal interface material 20a and cooled by the heat dissipation module. Finally, the mounting seat 10 is mounted to the mainboard by the screws 40 extending through the setting holes 16 and engaging with the mainboard. The heat generated by the heat generating component 80 is conducted to the block 50, absorbed by the heat pipe 30, and then transferred to the fin unit 90. When the forced airflow flows through the channels 94 of the fin unit 90, the heat is efficiently carried away by the airflow, thus maintaining stable operation conditions.

Because of the existence and configuration of the groove 56 defined on the block 50, the heat generating component 80 can be fittingly packaged in the groove 56 and enclosed by the lateral sides 57 of the block 50. The heat generating component 80 is brought into contact with both the bottom 58 and the lateral sides 57 of the groove 56, thus increasing the contact surface area between the block 50 and the heat generating component 80, and enhancing the heat dissipation efficiency of the heat dissipation module. According to one aspect of the present heat dissipation module, the heat generating component 80 can transfer its generated heat, through its top surface 81, to the bottom 58 of the block 50. In another aspect, the heat generating component 80 can also transfer its generated heat, through lateral sidewalls 82 thereof, to the lateral sides 57 of the block 50.

It is understood that the invention may be embodied in other forms without departing from the spirit thereof. Thus, the present embodiment is to be considered in all respects as illustrative and not restrictive, and the invention is not to be limited to the details given herein.

What is claimed is:

1. A heat dissipation module for removing heat from a heat generating component, comprising: a thermal contact block comprising a first surface and a second surface opposite to the first surface; a fin unit; a heat pipe with one end thereof thermally attached to the fin unit and another end thereof thermally attached to the first surface of the block; and a mounting seat, wherein a receiving groove is defined in the mounting seat for receiving the block therein, and the heat pipe is attached to the mounting seat; wherein a further groove is defined in the second surface of the block and the further groove is configured to fittingly receive the heat generating component therein; and wherein the further groove comprises a bottom and a plurality of lateral sides, a size of the bottom and a height of each of the lateral sides of the further groove are dimensioned so that, when the heat generating component is packaged in the further groove of the block, the heat generating component is brought into contact with the bottom and the lateral sides of the further groove.

2. The heat dissipation module of claim 1, wherein an arc-shaped groove is defined in the mounting seat for receiving said one end of the heat pipe, said arc-shaped groove being connected to and communicating with said receiving groove.

3. The heat dissipation module of claim 2, wherein the fin unit comprises a plurality of fins, each fin defines a cutout therein, the cutouts cooperatively defining a space for receiving said another end of the heat pipe therein.

4. The heat dissipation module of claim 3, wherein the heat pipe comprises an evaporating portion and a condensing portion extending from the evaporating portion, said evaporating portion being arc-shaped and received in the arc-shaped groove of the mounting seat, said condensing portion being received in the space defined by the cutouts of the fins.

5. The heat dissipation module of claim 1, wherein a thermal interface material is placed between the first surface of the block and the heat pipe.

6. A heat dissipation module comprising:
a heat generating component,
a copper block,
a mounting seat onto which the copper block is mounted,
a heat pipe having a first end thereof thermally attached to the copper block, and
a fin unit being thermally attached to a second end of the heat pipe, wherein a groove is defined in one surface of the copper block for receiving the heat generating component therein, the groove comprising a bottom and a plurality of lateral sides,
wherein the heat generating component is fittingly received in the groove of the copper block, the heat generating component comprising a top surface and a plurality of lateral sidewalls, the bottom and the lateral sides of the groove being brought into contact with the top surface and the lateral sidewalls of the heat generating component, respectively.

7. The heat dissipation module of claim 6, wherein a receiving groove is defined in the mounting seat for receiving the copper block therein.

8. The heat dissipation module of claim 7, wherein the heat pipe is partially flattened and comprises an evaporating portion and a condensing portion, wherein the evaporating portion received in an arc-shaped groove defined in the mounting seat communicates with the receiving groove, and the condensing portion is combined with the fin unit.

9. The heat dissipation module of claim 8, wherein a thermal interface material is placed between the heat generating component and the copper block, and between the heat pipe and the copper block.

10. The heat dissipation module of claim 8, wherein the evaporating portion of the heat pipe is arc-shaped and is thermally attached to another heat generating component.

* * * * *